United States Patent
DaDalt

(10) Patent No.: US 7,733,188 B2
(45) Date of Patent: Jun. 8, 2010

(54) PHASE LOCKED LOOP

(75) Inventor: Nicola DaDalt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/536,367

(22) Filed: Sep. 28, 2006

(65) Prior Publication Data

US 2008/0068093 A1    Mar. 20, 2008

(30) Foreign Application Priority Data

Sep. 6, 2006   (DE) .................. 10 2006 041 804

(51) Int. Cl.
*H03L 7/00*   (2006.01)
(52) U.S. Cl. .......................... 331/16; 331/17
(58) Field of Classification Search ............ 331/17, 331/16
See application file for complete search history.

(56) References Cited

U.S. PATENT DOCUMENTS

| | | | |
|---|---|---|---|
| 4,942,370 A | 7/1990 | Shigemori | |
| 5,600,272 A | 2/1997 | Rogers | |
| 6,583,675 B2 * | 6/2003 | Gomez | 331/17 |
| 7,209,017 B2 * | 4/2007 | Sze et al. | 331/179 |
| 2006/0208805 A1 * | 9/2006 | Galloway et al. | 331/16 |
| 2006/0255864 A1 * | 11/2006 | Vandel | 331/16 |

FOREIGN PATENT DOCUMENTS

| | | |
|---|---|---|
| DE | 3806461 | 9/1989 |
| DE | 102006012428 | 9/2006 |
| JP | 01218214 | 8/1989 |

OTHER PUBLICATIONS

"Modeling, Design and Characterization of a New Low-Jitter Analog Dual Tuning LC-VCO PLL Architecture", Roberto Nonis, et al., IEEE Journal of Solid State Circuits, vol. 40, No. 6, Jun. 2005.

* cited by examiner

*Primary Examiner*—Joseph Chang
(74) *Attorney, Agent, or Firm*—Dicke, Billig & Czaja, PLLC

(57) ABSTRACT

A phase locked loop is disclosed. One embodiment includes a phase comparator having two phase comparator inputs and a phase comparator output. A filter having a filter input and a filter output is provided, wherein the filter input is connected to the phase comparator output. A voltage controlled oscillator has a first oscillator input and an oscillator output. The first oscillator input is connected to the filter output and the oscillator output is connected to a first of the two phase comparator inputs. The oscillator has a second oscillator input. A coupling element is connected in parallel to the filter and arranged between the phase comparator output and the second oscillator input in such a way, that an output signal of the phase comparator is amplified and input to the second oscillator input.

3 Claims, 3 Drawing Sheets

PHASE LOCKED LOOP

CROSS-REFERENCE TO RELATED APPLICATIONS

This Utility Patent Application claims priority to German Patent Application No. DE 10 2006 041 804.2 filed on Sep. 6, 2006, which is incorporated herein by reference.

BACKGROUND

The present invention relates to a phase locked loop.

A phase locked loop (PLL) is a phase coupled control circuit, which is often used in electronic circuits, in particular for clock synchronisation. Conventionally, an integrated electronic circuit is called PLL, which constitutes essentially a controlled oscillator, if a phase coupled control loop is used in order to synchronize a reference frequency.

In particular in telecommunication appliances, phase locked loops are utilized in order to convert an input signal having a low frequency into an output signal having a high frequency. The output frequency of the phase locked loop should conventionally be an integer multiple of the input frequency. It is desired to generate a low noise high frequency output signal having a predetermined frequency.

The conventional phase locked loops include a phase comparator PFD, a voltage controlled oscillator VCO and a feed back loop running from the output 20 of the voltage controlled oscillator VCO to the input 10b of the phase comparator PFD; see FIG. 1. A frequency divider FD is provided in the feedback loop. The frequency divider divides the frequency of the feed back signals from the oscillator VCO by an integer N. The phase comparator compares the feed back signal with a periodic clock signal fed to an input 10a. The output of the phase comparator is a measure for the size of the phase difference between the feedback signal and the input periodic clock signal. Once an equilibrium state is reached, the phase and therefore also the frequency of the input signals of the phase comparator are equal. The output frequency of the voltage controlled oscillator must therefore be equal to N-times the frequency of the input clock signal.

The phase locked loop (PLL) must be designed in such a way, that the control loop reaches a stable equilibrium as fast as possible. If the output frequency of the voltage controlled oscillators deviate only by a small amount from the reference frequency, then the oscillator is readjusted. If the readjustment is too strong, then a negative phase difference at the input of the phase comparator may turn into a positive phase difference or vice versa. Instead of reaching a stable state, the control loop begins to oscillate. This means that the frequency of the output signal of the voltage control oscillator does not reach an essentially stable unaltered value; instead it oscillates about the reference frequency of the input signal of the phase locked loop. In order to prevent this, the charge pump CP and the filter LF are arranged between the output of the phase comparator PFD and the input of the voltage control oscillator. Readjustment occurs in a very fast succession (i.e. the control frequency is very high). These high control frequencies are suppressed by a low pass filter and consequently a small tolerance region is realized. The phase locked loop reaches a stable equilibrium after a while.

The charge pump outputs a current signal corresponding to the output of the phase comparator to the low pass filter LF. The low pass filter includes a resistor R, which is connected in serious with a capacitor C1. An additional capacitor C2 may be connected in parallel to the resistor and the capacitor C1. The second capacitor is not necessary for stabilising the phase locked loop. The low pass filter is essentially an integrator, which smoothes the signal from the charge pump. The resistor provides for an additive proportional amplification of the input current.

The disadvantage of the conventional phase locked loop is its noise, which is inevitably generated by the plurality of its noise sources. In particular, the low pass filter LF introduces noise components to the input signal of the voltage controlled oscillator. The main noise sources are depicted by the reference signs 30, 40 and 50 in FIG. 1. It is assumed, that the noise is added to the proper signal. Therefore, the noise sources are depicted as adders, which are connected to the actual components CP, LF and VCO. The noise of the charge pump is symbolized by the adder 30 in FIG. 1. Reference sign 40 represents the addition of noise of the low pass filter LF to the output signal of the low pass filter LF. Reference sign 50 represents the noise of the voltage controlled oscillator. Each noise source contributes to the overall noise in different frequency areas. The noise of the charge pump is a low frequency noise; the noise of the voltage controlled oscillator is high frequency noise. The low pass filter generates noise in an intermediate frequency region.

The noise from the voltage controlled oscillator is essentially filtered by the low pass filter and therefore does not pose great problems. If it is desired to provide a phase locked loop, which may process input signals having a wide frequency band width, then the noise of the charge pump CP and of the low pass filter LF is problematic. The output current of the charge pump could be increased as a counter measure against noise. The amplitude of the noise of the charge pump would be reduced in relation to the amplitude of the current. However, it is disadvantages, that the power consumption of the phase locked loop is considerably increased. Furthermore, the current may not be increased indefinitely without influencing the residual components such as the low pass filter. The noise could be suppressed by reducing the resistance R of the low pass filter. As a result, the band width of the phase locked loop is reduced. The band width relates to the allowed frequency region for the periodic clock signal at input 10a of the phase comparator. If the frequency of the clock signal lies outside of the frequency band width, then the phase locked loop does not reach a stable equilibrium state.

For these and other reasons, there is a need for the present invention.

SUMMARY

One embodiment of the invention is a phase locked loop, which includes a phase comparator having two phase comparator inputs and a phase comparator output. A filter having a filter input and a filter output is provided, wherein the filter input is connected to the phase comparator output. A voltage controlled oscillator has a first oscillator input and an oscillator output. The first oscillator input is connected to the filter output and the oscillator output is connected to a first of the two phase comparator inputs. The oscillator has a second oscillator input. A coupling element is connected in parallel to the filter and arranged between the phase comparator output and the second oscillator input in such a way, that an output signal of the phase comparator is amplified and input to the second oscillator input.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
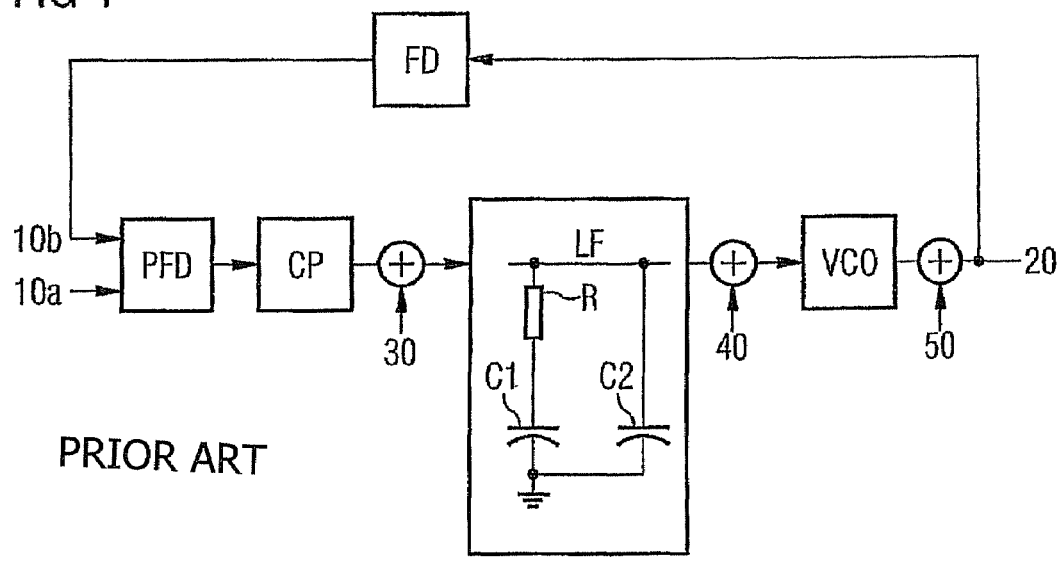
FIG. 1 illustrates a block diagram of a phase locked loop according to the state of the art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a phase locked loop, which has a great band width and low noise.

In one embodiment, the phase locked loop according to the present invention includes a phase comparator having two phase comparator inputs and a phase comparator output. A filter, in particular a low pass filter, having a filter input and a filter output is also provided in the phase locked loop according to the present invention. The filter input is connected to the phase comparator output. The phase locked loop includes a voltage controlled oscillator having a first oscillator input and an oscillator output. The first oscillator input is connected to the filter output. The oscillator output is connected with one of the two phase comparator inputs. Unlike the state of the art, the voltage controlled oscillator includes two oscillator inputs. Furthermore, the phase locked loop includes a coupling element such as an amplifier element. The coupling element is connected in parallel to the filter. An output signal from the phase comparator is coupled by the coupling element to the input of the second oscillator.

The circuit according to the present invention enables reducing a resistance of the filter or deleting the resistance as a whole without reducing the band width of the phase locked loop of the present invention. The coupling element compensates the reduction of the band width, whereby the resistance is reduced. Therefore, one noise source, namely the resistance of the filter, may be reduced or eliminated.

According to one embodiment of the present invention, the voltage controlled oscillator is adapted to generate an oscillator output signal having an oscillator frequency, which depends on a sum of the first and second oscillator input signal at the first and second oscillator input. The voltage controlled oscillator according to the present invention acts like a voltage controlled oscillator having a single input, which has an input voltage equal to the sum of the output voltage of the filter and of the amplifier element. The oscillator according to the present invention may be implemented in such a way that an addition element adds the output voltage of the filter and the amplifier element and inputs the sum into a voltage controlled oscillator having only one input.

The sum of the input voltages of the voltage controlled oscillator according to the present invention has the effect that the amplifier element has essentially the same impact on the transfer function between the output of the phase comparator and the input of the voltage controlled oscillator as a resistor in the filter. This becomes clear, if one compares the transfer function of a conventional phase locked loop to the transfer function of the phase locked loop according to the present invention:

Transfer function of conventional PLL≈R+1/sC

R is the resistance of the filter. C represents the capacitance of the capacitor. The term s combines the angular frequency w with the imaginary number i ($i^2=-1$), that is s=iw. An increasing angular frequency iw leads to a decrease of the relation between the input voltage of the oscillator and the output voltage of the oscillator of the phase comparator. In this respect, the transfer function represents a filter.

Transfer function of the PLL according to the present invention≈$K_{ff}$+1/sC.

The above equation is only applicable, if the filter does not have a resistance. Otherwise the resistance R would have to be added. $K_{ff}$ represents the amplification factor, i.e. the amount by which the amplifier element amplifies the output voltage of the phase comparator. The band width of the transfer function increases, if the resistance T or the amplification factor $K_{ff}$ increases. Therefore, the band width may be increased by appropriately choosing the amplification factor $K_{ff}$ of the amplifier element without increasing noise.

Preferably, the voltage controlled oscillator includes a first controllable capacitor, whereby a capacitance of a capacitor is controllable by the first oscillator input signal. A second capacitor is connected in parallel to the first capacitor. The capacitance of the second capacitor may be controlled using the second oscillator input signal. Both capacitors are preferably constituents of an LC-Oscillating Circuit. An inductor having a predetermined inductance $L_{VCO}$ is connected in parallel to the capacitors. The total capacitance $C_{VCO}$ of the oscillator circuit is the sum of the capacitances of the two capacitors of the oscillator. The angular frequency of the oscillating circuit is defined by $w^2=1/(L_{VCO}*C_{VCO})$. The total capacitance depends on the added input voltages of the voltage controlled oscillator.

Figure 2:
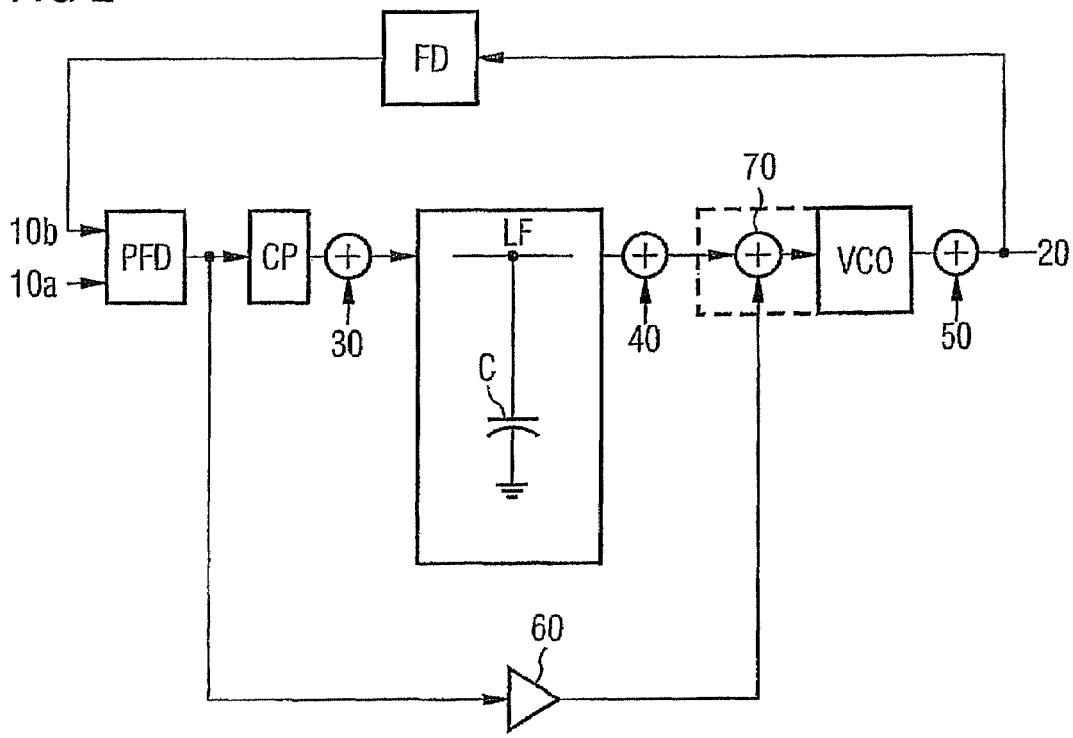
FIG. 2 illustrates a block diagram of the phase locked loop according to the embodiment of the present invention.

Preferably, the filter includes merely a filter-capacitor. The band width of the phase locked loop is provided by the amplifier element. Noise is reduced due to the lack of a resistor. Preferably, a charge pump is arranged between the phase comparator output and the low pass filter input. A frequency divider may be provided between the oscillator output and the first of the two phase comparator inputs. The frequency divider divides a frequency of the feedback signal by an integer, such that the frequency of the output signal of the phase locked loop is an integer multiple of the frequency of the input signal of the phase locked loop. FIG. 2 illustrates a block diagram of a phase locked loop according to the embodiment of the present invention. If corresponding reference signs are used in FIGS. 1 and 2, then they make reference to corresponding subject matter. The phase locked loop according to one embodiment includes a phase comparator PFD, a charge pump CP, a low pass filter LF, a voltage controlled oscillator VCO as well as a frequency divider FD. The output signal 20 of the voltage controlled oscillator is fed back to the input 10b of the phase comparator PFD via the frequency divider FD. A second input 10a of the phase comparator PFD functions as input of the phase locked loop. The phase comparator PFD, the charge pump CP, the low pass filter LF and the voltage controlled oscillator are connected to each other in line. Insofar, the phase locked loop according to one embodiment corresponds to the known phase locked loop in FIG. 1.

Unlike the conventional phase locked loop, in one embodiment the phase locked loop includes an additional amplifier element 60. The amplifier element 60 is connected to the output of the phase comparator PFD. The voltage at the output of the phase comparator PFD is a function of the phase difference at the input of the phase comparator. If the phase difference at the input is Zero, then the signals at the input 10a and 10b have the same frequency and phase. This state is the equilibrium state of the phase locked loop. The equilibrium state is supposed to be reached fast and must be stable. The amplifier element amplifies the output voltage of the phase comparator and provides a voltage signal amplified by the predetermined factor $K_{ff}$ to the voltage controlled oscillator VCO. Unlike the state of the art, the voltage controlled oscillator VCO in FIG. 2 includes two inputs; one input is connected to the output voltage to the low pass filter and the other input is connected to the output voltage to the amplifier element 60. The voltage signals at the inputs of the voltage control oscillator VCO are added to each other. The resulting sum controls the frequency of the signal at the output 20 of the phase locked loop according to the embodiment. A further important difference between the state of the art and the present embodiment is found in the structure of the low pass filter LF. The low pass filter LF includes only the capacitor C. The resistor R illustrated in FIG. 1 is missing.

Furthermore, the noise sources of the charge pump CP, of the low pass filter LF and the voltage controlled oscillator VCO are identified by the reference sings 30, 40 and 50.

The following formula represents the transfer function between the output of the charge pump CP and the output 10 of the phase locked loop.

$$2\Pi K_v N/(S^2 CN + sCK_{ff}K_v + IK_v)$$

Π represents the number Pi. N is an integer; the frequency divider divides the frequency of the feed back signal by that integer. $K_v$ is the amplification factor of the voltage controlled oscillator VCO. The term s is an abbreviation for iw, wherein $i^2 = -1$ and w is the angular frequency. C is the capacitance of the capacitor of the low pass filter. $K_{ff}$ is the amplification factor of the amplifier element.

The transfer function of the low phase locked loop according to FIG. 1 without capacitor C2 is given below.

$$2\Pi Kv(1+sCR)N/(s^2 CN + sCRIK_v + IK_v)$$

Figure 3:
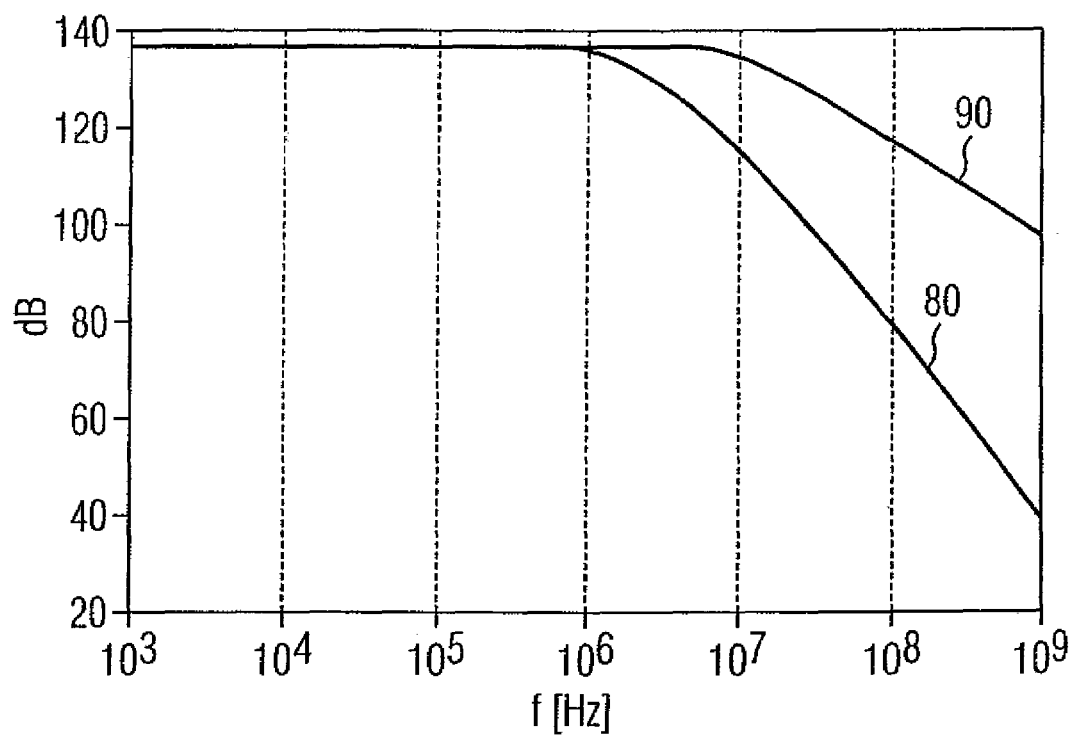
FIG. 3 illustrates an illustration of the characteristics of the transfer function for noise of the state of the art phase locked loop and for the phase locked loop according to the embodiment.

FIG. 3 illustrates the graph of the above transfer function. The different parameters have been chosen in the following way: I=50 uA, R=30 KOhm, C=5 pf, $K_v$=2 GHz/V, N=50.

Furthermore, $K_{ff}$ is chosen in such a way, that the missing resistance R is compensated. Therefore the following holds: $K_{ff}=I*R$. The x-axis in FIG. 3 represents the frequency in Hertz. The y-axis is the amplitude of the noise transfer function in dB. Reference sign 90 illustrates the characteristics of the transfer function of a conventional phase locked loop. The transfer function according to the present invention is represented by the curve 3 in FIG. 3. It is apparent that the phase locked loop according to the present invention suppresses noise of the charge pump more effectively. The course of the curves 80 and 90 is almost identical in the frequency range between $10^3$ and $10^6$ Hz. At higher frequencies, the noise of a phase locked loop according to the present invention is suppressed far more than the noise of the conventional phase locked loop.

Figure 4:
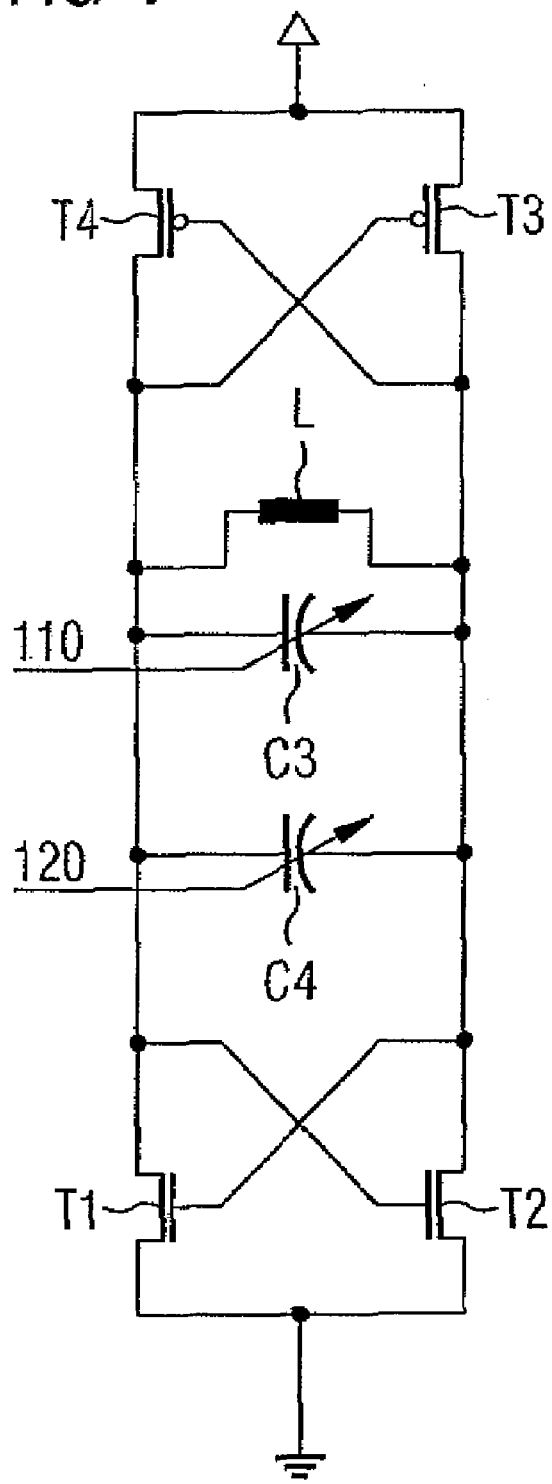
FIG. 4 illustrates a block diagram of a voltage controlled oscillator according to one embodiment of the present invention.

FIG. 4 illustrates an embodiment of the voltage controlled oscillator used in the present invention. The oscillator is essentially an LC-Oscillating Circuit having an inductor L and two capacitors C3 and C4 connected in parallel. C3 is the first capacitor of the voltage controlled oscillator; C4 is the second capacitor of the voltage controlled oscillator. Both capacitors C3 and C4 are controllable. The first capacitor C3 receives a voltage signal from the amplifier element across the line 110. A second line 120 represents a further input for the voltage signal of the low pass filter. The Eigen-frequency of the oscillator circuit is equal to $w^2 = (2\Pi f)^2/L(C3+C4)$.

L represents the inductance of the inductor in FIG. 4. C3 and C4 represent the capacitance of the corresponding capacitors.

The oscillating circuit in FIG. 4 includes two transistors T1 and T2. The gate of transistor T1 is connected to the drain of transistor T2; correspondingly, the gate of transistor T2 is connected to the drain of transistor T1. The sources of both transistors T1 and T2 are connected to ground potential. The transistor circuit constituted by the transistor T1 and T2 is connected in parallel to the controllable capacitor C4 using the drains. Furthermore, two transistors T3 and T4 are illustrated in FIG. 4, the gates of both transistors T3 and T4 are inverted. The inverted gate of transistor T3 is connected to the drain of transistor T4; correspondingly, the inverted gate of transistor T4 is connected to the drain of transistor T3. The sources of both transistors T3 and T4 are connected to each other and a further voltage source (not illustrated) is provided. The transistor circuit consisting of the transistors T3 and T4 is connected with its drains in parallel to the inductor L.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:
1. A method for generating a periodic signal, comprising:
  receiving a reference signal;
  executing a phase comparison between the reference signal and a feed back signal;
  outputting a phase comparison signal depending on a size of a phase difference between the reference signal and the feed back signal;
  applying a charge pump to the phase comparison signals and providing a charge pump output;
  filtering the phase comparison signal from the charge pump output using a filter comprising only a capacitor,
  coupling the phase comparison signal to an oscillator via an amplifier, generating the periodic signal using the oscillator, wherein a frequency of the periodic signal is generated depending on the filtered phase comparison signal and depending on the coupled phase comparison signal, wherein an amplification factor of the amplifier is chosen depending from a current at the charge pump output; and feeding back the periodic signal from the oscillator, to provide a feedback signal for carrying out the phase comparison.

2. The method for generating a periodic signal according to claim 1, comprising wherein the process of coupling includes the process of amplifying or attenuating the phase comparison signal.

3. The method for generating a periodic signal according to claim 1, comprising filtering the phase comparison signal using a low pass filter.

\* \* \* \* \*